United States Patent [19]
Furuya

[11] 4,432,133
[45] Feb. 21, 1984

[54] METHOD OF PRODUCING A FIELD EFFECT TRANSISTOR

[75] Inventor: Toshikazu Furuya, Kawasaki, Japan
[73] Assignee: Fjuitsu Limited, Kawasaki, Japan
[21] Appl. No.: 406,978
[22] Filed: Aug. 10, 1982
[51] Int. Cl.³ .................... H01L 21/265; H01L 21/28
[52] U.S. Cl. .................................. 29/571; 29/576 B; 29/578; 29/591
[58] Field of Search ............ 29/571, 578, 591, 576 B; 357/68

[56] References Cited

U.S. PATENT DOCUMENTS

| | | | |
|---|---|---|---|
| Re. 28703 | 2/1976 | Velde et al. ............................ | 29/571 |
| 3,699,646 | 10/1972 | Vasdasz ............................. | 29/578 X |
| 3,739,237 | 6/1973 | Shannon ............................. | 29/571 X |
| 3,945,030 | 3/1976 | Seales ................................ | 29/578 X |
| 4,141,022 | 2/1979 | Sigg et al. .......................... | 29/591 X |

Primary Examiner—G. Ozaki
Attorney, Agent, or Firm—Staas & Halsey

[57] ABSTRACT

A method for producing a MOSFET which includes the steps of forming a thick insulating layer having an inclined surface and surrounding the active region of a semiconductor substrate, forming a thin insulating layer on the active region, forming a gate electrode crossing the thin insulating layer and extending on the thick insulating layer, and forming a source region and a drain region in the active region in which method the step of forming the gate electrode includes the steps of forming a conductive layer on the thin insulating layer and thick insulating layer, forming a resist layer on the conductive layer selectively exposing the resist layer to an energy ray to define a gate electrode pattern area of which a portion above the inclined surface and above the end portions of the active region is wider than another portion above the middle portion of the active region developing the resist layer and selectively etching the conductive layer by using the developed resist layer as a mask.

9 Claims, 5 Drawing Figures

METHOD OF PRODUCING A FIELD EFFECT TRANSISTOR

BACKGROUND OF THE INVENTION

1. Field of the Invention

The present invention relates to a field effect transistor (FET), and more particularly to a method for producing a metal insulator semiconductor (MIS) FET in which an active region is surrounded by a thick insulating layer.

2. Description of the Prior Art

A MISFET can control a channel current flowing between a source and a drain by supplying a voltage to a gate electrode formed on a thin insulating film on a semiconductor substrate. A well-known metal-oxide semiconductor (MOS) FET is one kind of MISFET. For example, a number of MOSFETs are produced in a semiconductor chip for an integrated circuit. Active regions of the MOSFETs are formed in a semiconductor substrate and are isolated from each other by suitable isolation means, e.g., a thick insulating layer which is formed on a field region of the semiconductor substrate and surrounds each of the active regions. The thick insulating layer (i.e., a so-called field insulating layer) is also intended to prevent a parasitic MOS effect and a parasitic capacitance effect.

A method for producing the above-mentioned MOSFET is now explained with reference to FIGS. 1 and 2.

A silicon semiconductor substrate 1 is selectively oxidized to form a thick insulating layer (i.e., a field insulating layer) 2. Namely, silicon semiconductor substrate 1 is thermally oxidized to form a thin silicon dioxide layer (not shown) on substrate 1. A silicon nitride layer (not shown) is deposited on the thin silicon dioxide layer and is then selectively etched by a conventional photo-etching method. The portion of the silicon substrate 1 which is not covered by the silicon nitride layer is sufficiently thermally oxidized to form a thick insulating layer 2 of silicon dioxide. the silicon nitride layer and the thin silicon dioxide layer under it are removed by etching. Thus, the thick insulating layer 2 is located on a field region 3 and surrounds an active region 4 of the silicon substrate 1. The active region 4 of the silicon substrate 1 is slightly oxidized to form a thin insulating layer 5 of silicon dioxide.

Then a gate electrode 6 is formed on the thick insulating layer 2 and thin insulating layer 5 crossing the active region 4 and extending above the field region 3. The a conductive material (e.g., polycrystalline silicon) of the electrode 6 is deposited on the thick insulating layer 2 and the thin insulating layer 5 to form a conductive layer. A photoresist (not shown) is applied to the conductive layer, exposed by light passing through a photomask having a gate electrode pattern, and is developed to form a gate electrode photoresist pattern (not shown). The portion of the conductive layer which is not covered by the gate electrode photoresist pattern is removed by etching to form the gate electrode 6.

In order to form a source region S and a drain region D in the active region 4 of the silicon substrate 1, N-type or P-type impurities are introduced into the active region 4, except for a portion covered by the gate electrode 6, by an ion implantation method. Thereafter, an annealing treatment is carried out. A source electrode and a drain electrode (not shown) are formed in accordance with a conventional production method to obtain the MOSFET.

In the case of the above-mentioned production method, however, portions of the gate electrode 6 to be formed are undesirably etched on the inclined surface of thick insulating layer 2 and above the end portions of the active region 4, as illustrated in FIG. 1. Although the gate electrode pattern of the photomask comprises straight sides, constricted portions of the gate electrode photoresist pattern corresponding to a constricted portions 7 and 8 of the gate electrode 6 are formed due to a variation of the photoresist layer thickness and irregular reflection of the exposing light at the inclined surface of the thick insulating layer 2. Therefore, the constricted portions 7 and 8 of the gate electrode 6 are formed during the etching step. When the source region S and drain region D are formed, projecting portions of these regions are formed next to the constricted portions 7 and 8 of the gate electrode 6, with the result that the threshold voltage varies, the leakage current is increased, and the breakdown voltage between the source and drain is decreased. The above disadvantages become more serious when a MOSFET having a short width W gate electrode (FIG. 1) i.e., a short channel length, is produced. Such a MOSFET having a short channel length is not suitable for a high frequency device. Furthermore, since a photoresist having a high sensitivity is used in the formation of a narrow gate electrode, the constricted portions of the gate electrode photoresist pattern are formed more easily.

SUMMARY OF THE INVENTION

An object of the present invention is to prevent the above-mentioned disadvantages from occurring.

Another object of the present invention is to improve the shape of the gate electrode.

Yet another object of the present invention is to provide a method for producing a MISFET having an improved gate electrode.

The above and other objects of the present invention are attained by providing a method for producing a MISFET comprising the steps of: forming a thick insulating layer having an inclined surface and surrounding the active region of a semiconductor substrate; forming a thin insulating layer on the active region; forming a gate electrode crossing the thin insulating layer and extending over the thick insulating layer; and forming a source region and a drain region in the active region. The step of forming the gate electrode comprises the steps of: forming a conductive layer on the thin insulating layer and the thick insulating layer; forming a resist layer on the conductive layer; selectively exposing the resist layer to an energy ray to define the gate electrode area of which a portion above the inclined surface and above the end portions of the active region is wider than another portion above the middle portion of the active region; developing the photoresist layer; and selectively etching the conductive layer by using the developed photoresist layer as a mask. A portion of the obtained gate electrode on the inclined surface and above the end portions of the active region is not narrower than another portion above the middle portion of the active region.

DESCRIPTION OF THE PREFERRED EMBODIMENT

Figure 3:
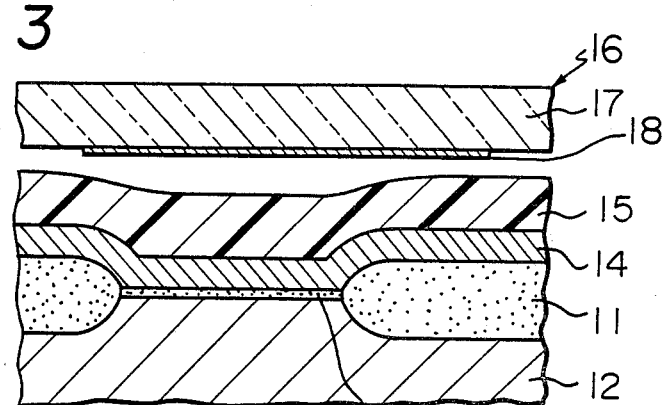
FIG. 3 is a schematic sectional view of a MOSFET in an intermediate stage of production in accordance with the present invention.

In FIG. 3, the thick insulating layer 11 comprising silicon dioxide, is formed by selectively and thermally oxidizing the silicon semiconductor substrate 12 in accordance with the above-mentioned step of the prior art. The thin insulating layer 13 comprising of silicon dioxide is then formed by thermally oxidizing the active region of the semiconductor substrate 12. A conductive material, polycrystalline silicon, is deposited on the thick insulating layer 11 and the thin insulating layer 13 by a chemical vapor deposition method to form a conductive layer 14 (FIG. 3). It is possible to use molybdenum, tungsten, titanium, tantalum, platinum, or a silicide thereof instead of polycrystalline silicon. In such a case, the above-mentioned metal or silicide is deposited by a sputtering method.

Figure 4:
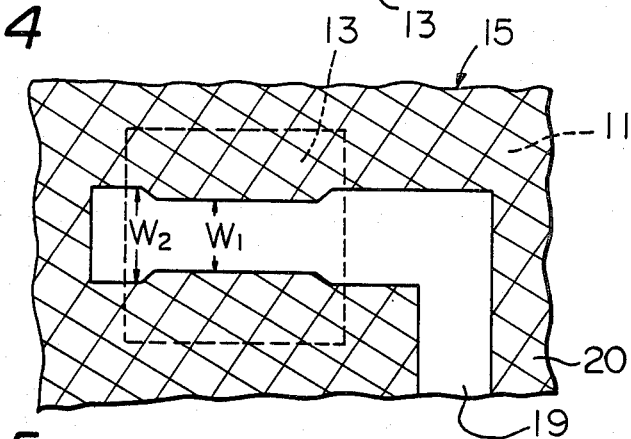
FIG. 4 is a schematic plan view of a MOSFET of FIG. 3.
Figure 5:
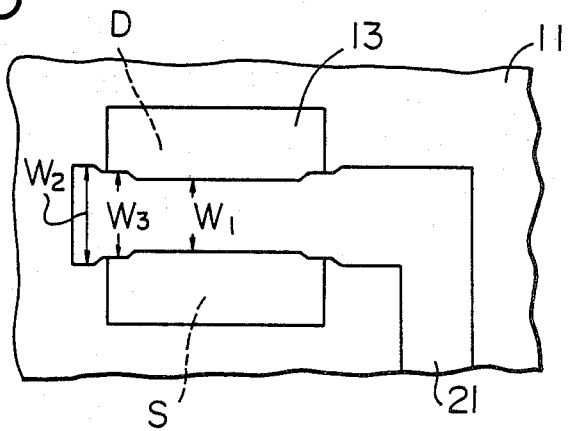
FIG. 5 is a schematic plan view of a MOSFET produced in accordance with the present invention.

A positive-type photoresist is applied to the conductive layer 14 by a spin coating method to form a photoresist layer 15. Then the photoresist layer 15 is exposed by light passing through a photomask 16 placed above it. The photomask 16 comprises a transparent glass substrate 17 and a mask 18 (of e.g. a chromium film) formed on it. The mask 18 has a gate electrode pattern the same shape as area 19, as shown in FIG. 4. The unexposed area 19 of the photoresist layer 15 is indicated by the non-crosshatched portion. The exposed area 20 is indicated by the crosshatched portion in FIG. 4. According to the present invention, the width $W_2$ of a portion of the unexposed area 19 which is above the inclined surface of the thick insulating layer 11 and above the end portion of the thin insulating layer 13 is larger than a width $W_1$ of another portion of the unexposed area 19 which is above the middle portion of the thin insulating layer 13. An ultra-violet ray or an X-ray can be used instead of the light passing through the photomask. In this case, a suitable resist for the ultra-violet ray or the X-ray should be used. It is also possible to expose the resist layer 15 by using an electron beam instead of light passing through photomask 16. The exposed photoresist is decomposed and the photoresist layer 15 is developed with a suitable developer so that the unexposed area of the photoresist layer 15 remains as a gate electrode photoresist pattern 21, as illustrated in FIG. 5. In this case, the width $W_3$ of a portion of the remaining photoresist pattern 21, which is above the inclined surface and above the end portion of the thin insulating layer 13, is smaller than the width $W_2$ of another portion above the thick insulating layer 11 and is equal to or larger than the width $W_1$ of the other portion above the middle portion of the thin insulating layer 13 since irregular reflection and scattering of the exposing light (or the electron beam) occurs due to the inclined surface.

Then, using the remaining (gate electrode) resist pattern 21 as a mask, conductive layer 14 is etched with a suitable etchant to form a gate electrode under the photoresist pattern 21. The shape of the obtained gate electrode is the same as that of the photoresist pattern 21.

N-type or P-type impurities are introduced into the active region of the silicon substrate 12 through the thin insulating layer 13 by an ion-implantation method so that the source region S and drain region D are formed. In this case, the gate electrode and the photoresist pattern 21 serve as a mask for preventing the impurities from penetrating into the substrate 12. The photoresist pattern 21 is removed and then the MOSFET is annealed. A source electrode and a drain electrode are formed in accordance with a conventional formation method. If necessary, an insulating film of, e.g., phosphosilicate glass is formed prior to the formation of the source and drain electrodes.

When a voltage is supplied to the gate electrode of the MOSFET, a channel forms between the source region S and drain region D and directly below the gate electrode. The channel length under the middle portion of the thin insulating layer is shorter than that under the end portions of the thin insulating layer so that the properties of the MOSFET, such as the threshhold voltage, are dependent upon the short channel length under the middle portion. Since the channel length under the end portions of the thin insulating layer is longer than that under the middle portion, it is possible to prevent the above-mentioned disadvantages from occurring at the end portions of the active region.

It will be obvious that the present invention is not restricted to the above-mentioned embodiments and that many variations are possible for a person skilled in the art without departing from the scope of the present invention.

I claim:

1. A method of producing a field effect transistor including a semiconductor substrate having an active region with a middle portion and end portions, and a field region, comprising the steps of:
    (a) forming a thick insulating layer on the field region of the semiconductor substrate, the thick insulating layer having an inclined surface and surrounding the active region of the semiconductor substrate;
    (b) forming a thin insulating layer on the active region of the semiconductor substrate;
    (c) forming a gate electrode on the thin and thick insulating layers, the gate electrode formed on a portion of the thin insulating layer and extending onto the thick insulating layer, and having first portions and a second portion, the first portions lying above the end portions of the active region and having a larger width than of the second portion lying above the middle portion of the active region; and
    (d) forming a source region and a drain region in the active region by selectively introducing impurities into the active region.

2. A method according to claim 1, wherein said step (c) of forming the gate electrode comprises forming the gate electrode of polycrystalline silicon.

3. A method according to claim 1, wherein said step (c) of forming the gate electrode comprises forming the gate electrode of a material selected from the group consisting of molybdenum, tungsten, titanium, tantalum, platinum, and silicides thereof.

4. A method according to claim 1, wherein said step (c) of forming the gate electrode comprises the substeps of:

(i) forming a conductor layer on the thin insulating layer and the thick insulating layer;
(ii) forming a resist layer on the conductor layer;
(iii) forming a photomask on portions of the resist layer, having a mask pattern, the mask pattern crossing the active region and having end portions which are wider than the middle portion of the active region;
(iv) exposing a portion of the resist layer which is not covered with the mask pattern to an energy ray passing through the photomask;
(v) developing the resist layer; and
(vi) selectively etching the conductor layer by using the developed resist layer as a mask.

5. A method according to claim 4, wherein said substep (ii) of forming the resist layer comprises forming a positive-type resist.

6. A method according to claim 4, wherein said exposing substep (iv) comprises using an energy ray selected from the group consisting of a light, an ultraviolet ray and an X-ray.

7. A method according to claim 1, wherein said step (c) of forming the gate electrode comprises the substeps of:
(i) forming a conductor layer on the thin insulating layer and the thick insulating layer;
(ii) forming a resist layer on the conductor layer;
(iii) selectively exposing the resist layer to an energy ray of an electron beam to define a gate electrode pattern area of which a portion above the inclined surface and above the end portions of the active region is wider than the portion above the middle portion of the active region;
(iv) developing the resist layer; and
(v) selectively etching the conductive layer by using the developed resist layer as a mask.

8. A method according to claim 7, wherein said substep (ii) of forming the resist layer comprises forming a positive-type resist.

9. A method for producing a field effect transistor in a semiconductor substrate having an active region with a middle portion and end portions and a field region, comprising the steps of:
(a) forming a thick insulating layer on the field region of the semiconductor substrate, the thick insulating layer having an inclined surface and surrounding the active region of the semiconductor substrate;
(b) forming a thin insulating layer on the active region of the semiconductor substrate;
(c) forming a gate electrode on the thin and thick insulating layers, comprising the substeps of:
(i) forming a conductor layer on the thin and thick insulating layers;
(ii) selectively exposing the conductor layer to an energy ray to define a gate electrode area having a portion above the inclined surface and end portions of the active region that is wider than a portion above the middle portion of the active region; and
(d) forming source and drain regions in the active region by selectively introducing impurities through the thin insulating layer into the active region.

* * * * *

UNITED STATES PATENT AND TRADEMARK OFFICE
CERTIFICATE OF CORRECTION

PATENT NO. : 4,432,133                                   Page 1 of 2

DATED : FEBRUARY 21, 1984

INVENTOR(S) : TOSHIKAZU FURUYA ET AL.

It is certified that error appears in the above-identified patent and that said Letters Patent is hereby corrected as shown below:

ON THE TITLE PAGE, after [22] insert the following:

--[30] Foreign Application Priority Data

Aug. 10, 1981 [JP] Japan ........... 56-124946--;

[57] ABSTRACT
            line 8, "in which method the" should be --. The--;

line 12, "layer" (first occurrence) should be --layer,--;

line 17, "region" should be --region,--; and "layer" should be --layer,--.

Col. 1, line 41, "the" should be --The--;
       line 49, "5" should be --5,--;
       line 50, delete "a";
       line 51, after "the" insert --gate--.

UNITED STATES PATENT AND TRADEMARK OFFICE
CERTIFICATE OF CORRECTION

PATENT NO. : 4,432,133
DATED : FEBRUARY 21, 1984
INVENTOR(S) : TOSHIKAZU FURUYA ET AL.

Figure 1:
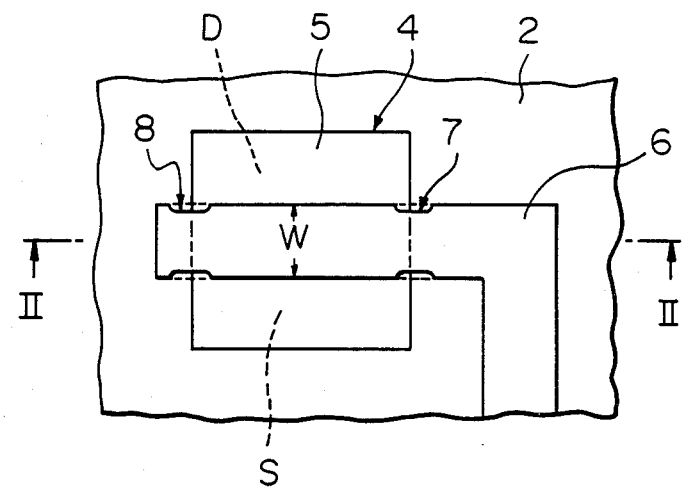
FIG. 1 is a schematic plan view of a MOSFET produced in accordance with the prior art.
Figure 2:
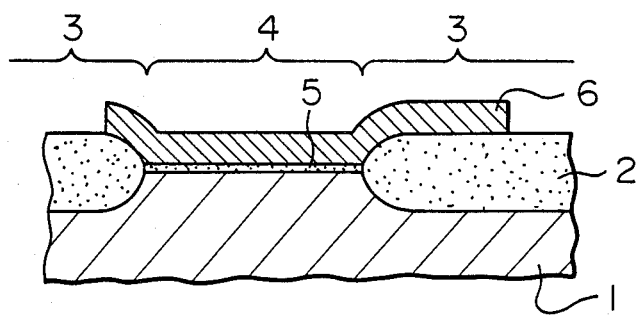
FIG. 2 is a schematic sectional view taken along line II—II of FIG. 1.

It is certified that error appears in the above-identified patent and that said Letters Patent is hereby corrected as shown below:

Col. 2, line 25 "(FIG. 1)" should be --(FIG. 1),--.

Col. 3, line 13, "11" should be --11,--;
      line 17, delete "of";
      line 67, "mask," should be --mask, the--.

Signed and Sealed this

Fourth Day of June 1985

[SEAL]

Attest:

DONALD J. QUIGG

Attesting Officer     Acting Commissioner of Patents and Trademarks